(12) United States Patent
Fu et al.

(10) Patent No.: US 11,067,642 B2
(45) Date of Patent: Jul. 20, 2021

(54) DEVICE FOR GENERATING A MAGNETIC FIELD OF CALIBRATION AND BUILT-IN SELF-CALIBRATION MAGNETIC SENSOR AND CALIBRATION METHOD USING THE SAME

(71) Applicant: Voltafield Technology Corporation, Jhubei (TW)

(72) Inventors: Nai-Chung Fu, Jhubei (TW); Ming-Yu Kuo, Jhubei (TW); Ta-Yung Wong, Jhubei (TW)

(73) Assignee: VOLTAFIELD TECHNOLOGY CORPORATION, Jhubei (TW)

( * ) Notice: Subject to any disclaimer, the term of this patent is extended or adjusted under 35 U.S.C. 154(b) by 0 days.

(21) Appl. No.: 16/807,382

(22) Filed: Mar. 3, 2020

(65) Prior Publication Data
US 2020/0300928 A1    Sep. 24, 2020

(30) Foreign Application Priority Data
Mar. 22, 2019   (TW) .................................. 108110181

(51) Int. Cl.
*G01R 33/00*   (2006.01)

(52) U.S. Cl.
CPC ..... *G01R 33/0017* (2013.01); *G01R 33/0035* (2013.01)

(58) Field of Classification Search
CPC ............ G01R 33/0035; G01R 33/0082; G01R 35/007
See application file for complete search history.

(56) References Cited

U.S. PATENT DOCUMENTS

| 5,532,584 A | 7/1996 | Jeffers et al. |
| 8,203,329 B2 | 6/2012 | Hohe et al. |

(Continued)

FOREIGN PATENT DOCUMENTS

| TW | 201318237 A1 | 5/2013 |
| TW | I420128 B | 12/2013 |

(Continued)

OTHER PUBLICATIONS

Taiwan Patent Office, "Office Action", dated Oct. 17, 2019, Taiwan.

*Primary Examiner* — Alvaro E Fortich
(74) *Attorney, Agent, or Firm* — Locke Lord LLP; Tim Tinkgkang Xia, Esq.

(57) ABSTRACT

The present invention provides device for generating magnetic field of calibration and built-in self-calibration (BISC) magnetic sensor and calibration method, in which a novelty structure utilized for generating a uniform, predetermined magnitude, and three-dimensional orthogonal or approximately orthogonal magnetic field of calibration is arranged in the magnetic sensor such that the magnetic sensor can perform BISC function for obtaining a calibrating information with respect to the magnetic field of calibration anytime and anywhere. The magnetic sensor can be arranged in the application device for measuring magnetic field under the real environment where the magnetic sensor is located and the calibrating information are utilized for calibrating the measuring result thereby improving and advancing the accuracy of measuring three-dimensional magnetic field.

19 Claims, 14 Drawing Sheets

(56) References Cited

U.S. PATENT DOCUMENTS

| | | | |
|---|---|---|---|
| 8,680,846 B2 | 3/2014 | Cesaretti et al. | |
| 8,896,295 B2 | 11/2014 | Friedrich et al. | |
| 9,608,570 B1* | 3/2017 | Jenkins | H03F 3/45968 |
| 9,823,090 B2 | 11/2017 | Foletto et al. | |
| 10,837,943 B2* | 11/2020 | Romero | G01D 5/145 |
| 2007/0205749 A1* | 9/2007 | Yakymyshyn | G01R 15/207 |
| | | | 324/117 R |
| 2009/0167301 A1* | 7/2009 | Ausserlechner | G01R 33/0035 |
| | | | 324/252 |
| 2010/0211347 A1 | 8/2010 | Friedrich et al. | |
| 2011/0031960 A1* | 2/2011 | Hohe | G01R 33/07 |
| | | | 324/202 |
| 2012/0016614 A1* | 1/2012 | Hohe | G01R 33/075 |
| | | | 702/85 |
| 2012/0274314 A1 | 11/2012 | Cesaretti et al. | |
| 2012/0293164 A1* | 11/2012 | Liou | G01R 33/0035 |
| | | | 324/202 |
| 2018/0081000 A1 | 3/2018 | Deak et al. | |
| 2018/0372810 A1 | 12/2018 | Jiang et al. | |

FOREIGN PATENT DOCUMENTS

| | | |
|---|---|---|
| TW | I437249 B | 5/2014 |
| WO | 2014009516 A1 | 1/2014 |
| WO | 2014139848 A1 | 9/2014 |

* cited by examiner

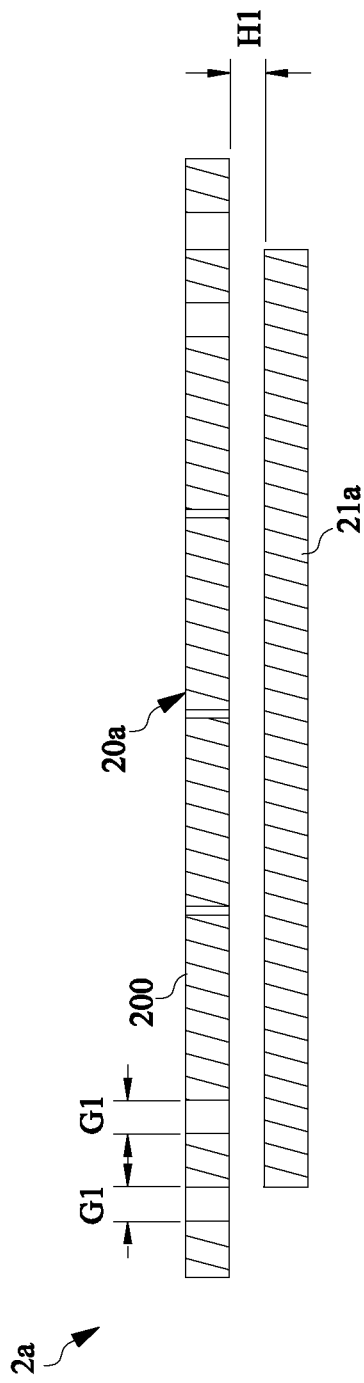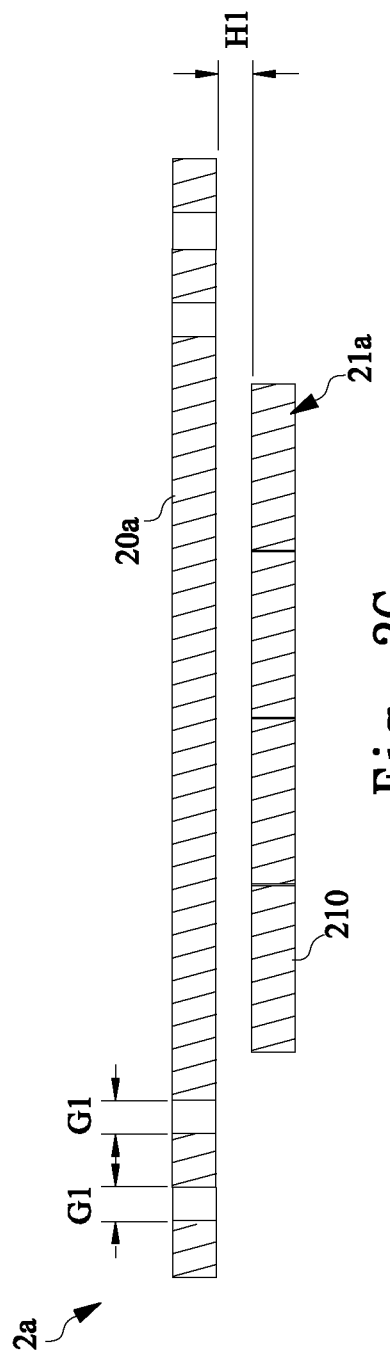

DEVICE FOR GENERATING A MAGNETIC FIELD OF CALIBRATION AND BUILT-IN SELF-CALIBRATION MAGNETIC SENSOR AND CALIBRATION METHOD USING THE SAME

CROSS REFERENCE TO RELATED APPLICATION

This application claims the benefit of Taiwan Patent Application Serial No. 108110181, filed Mar. 22, 2019, the subject matter of which is incorporated herein by reference.

BACKGROUND OF INVENTION

1. Field of the Invention

The present invention relates to a field of calibrating magnetic field, and more particularly, to a device for generating a magnetic field of calibration, a built-in self-calibration magnetic sensor and a calibration method using the device, wherein the device has a built-in platform for generating a three-dimensional uniform and magnitude adjustable calibration magnetic field.

2. Description of the Prior Art

With the advance of the technology, the application fields of the smart portable devices, such as mobile phones and wearable devices are gradually expanded. Generally speaking, magnetic field sensing units are usually adapted in the conventional smart portable devices for performing functions of location positioning, and orientation determination, for example.

A magnetoresistance (MR) effect is a common principle for detecting the magnetic field. Since the electrical resistance of some specific MR material will be varied with the variation of external magnetic field acting on the MR material, the MR material can be arranged in the sensing device for various kinds of application. Conventionally, the giant magnetoresistance (GMR) sensing device, and anisotropic magnetoresistance (AMR) sensing device are commonly used in the magnetic field sensing units.

Despite the application fields of the MR sensing devices are wildly adapted, there still remain some problems unsolved. For example, in some application fields, the sensitivity of the MR sensing devices will be affected by environmental factors, such as temperature, or magnetic field generated by the electrical elements surround the MR sensing devices. In addition, the sensing information generated by the MR sensing devices will also be affected by the manufacturing process, such as packaging process or bonding process. For example, the strain and stress variation would be usually induced when the packaging the MR sensing devices or bonding the MR sensing devices onto the circuit board. Because the Hall effect or sensitivity of the MR sensing device is highly sensitive to the influence of strain or stress, the accuracy of measuring result will be affected. Moreover, the sensitivity of each axis of the MR elements will be unevenly varied due to the manifestation of aging deterioration when the MR devices are utilized for a long period of time.

In order to solve the above-mentioned problems, it is an important topic for calibrating the magnetic sensor having MR sensing devices. In the conventional arts, such as a magnetic sensor apparatus disclosed in Taiwan Patent No. 1420128, for example, it disclosed a magnetic sensor apparatus has a substrate, a plurality of MR sensor units, a reset coil and a compensation coil. The compensation coil is disposed over the MR sensor units. The compensation coil is used for importing a compensating current, which generates a bias field on the MR sensor units for calibrating the MR sensor units affected by external interfered magnetic field. The calibrating effects could be adjusted and controlled by the magnitude of compensating current. In addition, U.S. Pat. No. 5,532,584 also disclosed a magnetic assembly in which a magnetoresistive (MR) sensing element is electrically isolated from two electrically conductive layers adjacent thereto and a predetermined calibration current through said electrically conductive layer produces a calibration magnetic field. The MR sensing device senses the calibration magnetic field and produces a calibration signal utilized to periodically compensate for changes in sensitivity and channel gain drift caused by time and temperature variations.

Furthermore, in the conventional arts, in order to solve the inaccuracy problems of magnetic sensor having MR sensing device, another measure such as the adjusting or changing the manufacturing process of the magnetic sensor is also adapted for improving the accuracy of measurement. However, since it takes resources to adjust or change the manufacturing process, other issues such as increasing cost or reducing yield rate, for example, would be induced. Moreover, even if the calibration is completed by the chip manufacturer before the MR sensing devices leaving the factory, the sensing accuracy could also be affected by the influence of strain or stress induced by packaging the MR sensing device or bonding the MR sensing device onto a circuit board performed subsequently. In addition, the accuracy may also be affected by different temperature effect of each magnetic sensor, or affected by aging factor due to long time usage whereby sensitivity of each axis of the MR sensing devices would be unevenly varied so that the magnetic sensor can't be accurately compensated. Because there are so many factors that may affect the accuracy of the MR sensing devices, if the MR sensing devices don't have the accurate and effective self-calibration ability on three-dimensional measurement after installing on the devices, it will cause the inconveniences in the application when the inaccurate factors are occurred.

Accordingly, how to improve the sensing accuracy when the magnetic sensor is utilized is an important issue that should be effectively solved. Therefore, these is a need to provide device for generating magnetic field of calibration and built-in self-calibration (BISC) magnetic sensor and calibration method so as to solve the insufficient part of the conventional arts.

SUMMARY OF THE INVENTION

Embodiments of the present invention provide a device for generating a calibration magnetic field and BISC magnetic sensor and calibration method, in which the device can generate three substantially orthogonal, even and stable magnetic fields for calibrating the magnetic sensor whereby the disadvantages such as unstable measurement of each axis after manufacturing or quality deviation due to the manufacturing process, for example, could be effectively improved. In addition, in order to provide more stable electrical current, the present invention further utilizes a single power module for providing electric currents to generate three-dimensional and stable magnetic field whereby the accuracy can be improved and application fields of the magnetic sensor can be greatly expanded after calibration. Even if the power module is varied or changed, the ratio of the three-dimensional magnetic field can be maintained thereby objective of accurate calibration can be achieved.

Embodiments of present invention provide a device for generating a calibration magnetic field and BISC magnetic sensor and calibration method, in which the magnetic sensor can perform the self-calibration anytime and anywhere before leaving the factory or after being installed on the application devices, such as portable devices, computers, laptop, for example, whereby the factors such as environmental effect, temperature effect, packaging or bonding effect, or aging effect due to long-time utilization that could affect the accuracy of the magnetic sensors can be truly reduced and the objectives of obtaining and providing accurate sensing result anytime and anywhere can be achieved.

In one embodiment, the present invention provides a device for generating magnetic field of calibration, which comprises a first conducting structure, a second conducting structure, and a conducting coil. The first conducting structure generates a first magnetic field with respect to a first axis through a first electric current. The second conducting structure is substantially parallel to the first conducting structure, and the second conducting structure generates a second magnetic field with respect to a second axis substantially orthogonal to the first axis through a second electric current. The conducting coil is peripherally arranged around the first and second conducting structures, and the conducting coil generates a third magnetic field with respect to a third axis substantially orthogonal to the first and second axes through a third electric current.

In one embodiment, the present invention provides a built-in self-calibration magnetic sensor which comprises a first magnetic field generating device, a magnetic field sensing unit, and a control module. The first magnetic field generating device comprises a first conducting structure, a second conducting structure, and a conducting coil, wherein the first conducting structure generates a first magnetic field through a first electric current, the second conducting structure is substantially parallel to the first conducting structure and generates a second magnetic field with respect to a second axis substantially orthogonal to the first axis through a second electric current, and the conducting coil is peripherally arranged around the first and second conducting structures and generates a third magnetic field with respect to a third axis substantially orthogonal to the first and second axes through a third electric current. The magnetic field sensing unit generates a sensing information in response to detection of the first, second and third magnetic fields. The control module is electrically coupled to the magnetic field sensing unit for receiving the sensing information associated with measuring result of magnetic field in each axis and comparing the sensing information corresponding to each axis with a predetermined magnetic field of the corresponding axis, respectively, for determining a calibration information associated with the first, second and third magnetic fields. The calibration information can be utilized to modify the sensing information generated by the magnetic sensor in the real detection of the practical application.

In one embodiment, the present invention provides a method for calibrating magnetic field, which is utilized to perform a self-calibration procedure, the method comprising steps of providing a magnetic sensor comprising a device for generating a calibration magnetic field, the device comprising a magnetic field sensing unit, generating, by the device, three different magnetic fields respectively along three different axes wherein each magnetic field has a predetermined magnitude and the three different magnetic fields are substantially orthogonal to each other, sensing, by the magnetic field sensing unit, the three different magnetic fields respectively along three different axes and generating a sensing information respectively corresponding to each axis, and comparing the sensing information of each axis with the predetermined magnitude of each magnetic field along the corresponding axis for determining a calibration information associated with each axis.

BRIEF DESCRIPTION OF THE DRAWINGS

Embodiments of the present invention will now be specified with reference to the drawings, in which:

FIGS. 3B and 3C respectively illustrate AA cross-sectional view and BB cross-sectional view of the structure shown in FIG. 3A;

DESCRIPTION OF THE PREFERRED EMBODIMENT

The following description provides preferred exemplary embodiments only and is not intended to limit the scope, applicability or configuration of the disclosure. Similar numerals are utilized to designate similar components. In addition, the following description of the preferred exemplary embodiments will provide those skilled in the art with an enabling description for implementing a preferred exemplary embodiment. It is understood that various changes may be made in the function and arrangement of elements without departing from the spirit and scope as set forth in the appended claims. The substantially parallel in the ensuing description is referred to exactly parallel or approximately parallel with an error angle range about −2 to 2 degree, which means that if the intersection angle of two objects is between −2 to 2 degrees, the two objects can be regarded as substantially parallel. The substantially orthogonal in the ensuing description is referred to exactly orthogonal or approximately orthogonal with an error angle range between −2 to 2 degrees, i.e. intersection angle ranging from about 88 degrees to 92 degrees. The error angle range is generated due to the manufacturing process and angle range may be varied with the type of manufacturing process which is well-known by the one having ordinary skills in the art, so that it should not be limited to the above-mentioned range.

Figure 1A:
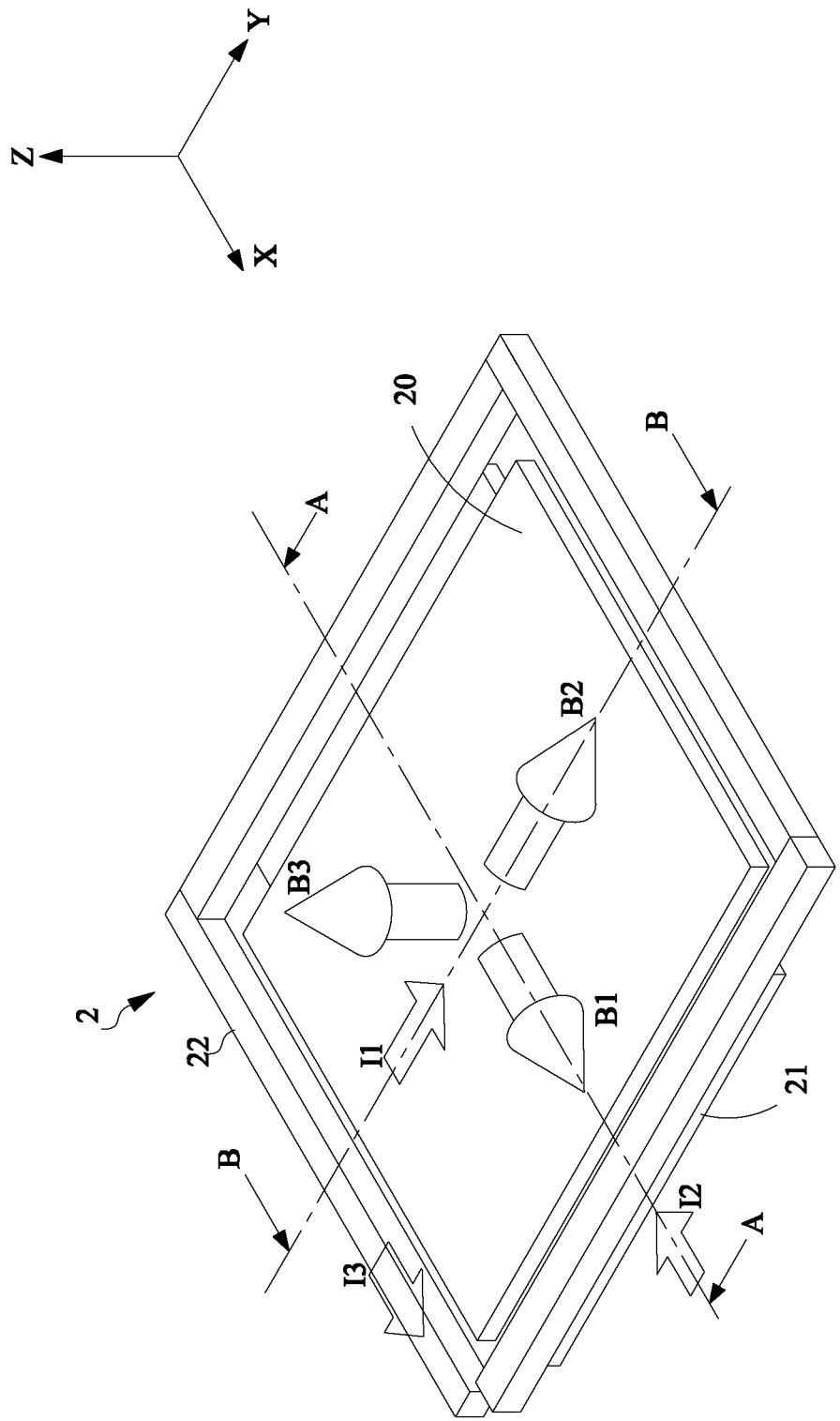
FIG. 1A illustrates a device for generating magnetic field of calibration according one embodiment of the present invention.
Figure 1B:
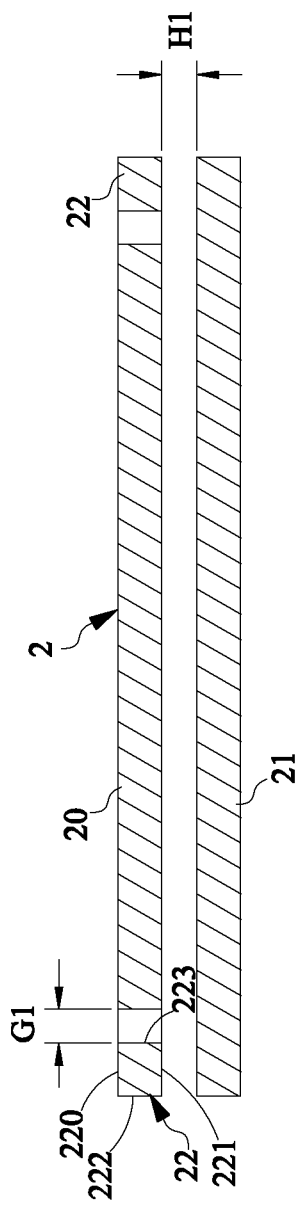
FIGS. 1B and 1C respectively illustrate AA cross-sectional view and BB cross-sectional view of the structure shown in FIG. 1A.
Figure 1C:
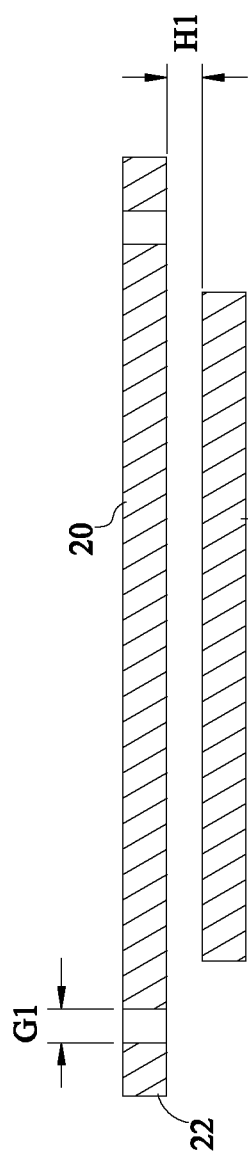

Please refer to FIGS. 1A to 1C, wherein FIG. 1A is referred to one embodiment of the device generating magnetic field of calibration, and FIGS. 1B and 1C are referred to AA cross-sectional view and BB cross-sectional view of FIG. 1A, respectively. In the present embodiment, the device 2 is utilized to generate three-dimensional calibration magnetic field. The device 2 comprises a first conducting structure 20, a second conducting structure 21, and a conducting coil 22. The first conducting structure 20 and the second conducting structure 21 are substantially parallel to each other. The conducting coil 22 is formed by a conducting wire wound to form the coil peripherally arranged around the first conducting structure 20, the second conducting structure 21, or first and second conducting structures 20 and 21, wherein the two ends of the conducting coil 22 are not connected to each other. In the present embodiment, the conducting wire peripherally arranged around the first conducting structure 20.

In the present embodiment, the first and second conducting structures 20 and 21 can respectively be, but should not be limited to, at least one rectangular sheet, hollowed metal conducting wire, a thick conducting plate, or a combination of metal layer and an ion implantation layer. In the present embodiment, the first conducting structure 20 has a distance H1 apart from the second conducting structure 21. The conducting coil 22 has a top surface 220, a bottom surface 221, an inner surface 223 close to the first conducting structure 20 and an outer surface 222 that is opposite to the inner surface 223, wherein the top surface 220 of the conducting coil 22 and the top surface of the first conducting structure 20 lie in substantially the same horizontal plane and the bottom surface 221 of the conducting coil 22 and the bottom surface of the first conducting structure 20 could lie in substantially the same horizontal plane. In addition, the dimension of distance H1 or size of the conducting structures 20 and 21 as well as the gap G1 between the conducting coil 22 and the first conducting structure 20 can be designed according to the user need and there has no specific limitation.

In the ensuing description, the way for generating the calibration magnetic field is further explained. The first conducting structure 20 is driven to generate a first magnetic field B1 along a first axis (X) with a known magnitude through a first electric current I1. Similarly, the second conducting structure 21, substantially parallel to the first conducting structure 20, is driven to generate a second magnetic field B2 along a second axis (Y) substantially orthogonal to the first axis (X) with a known magnitude through a second electric current I2. The conducting coil 22 is peripherally arranged around the first and second conducting structures 20 and 21. The conducting coil 22 is driven to generate a third magnetic field B3 along a third axis (Z) substantially orthogonal to the first and second axes (X and Y) through a third electric current I3.

In one embodiment, the first electric current I1 flows into the first conducting structure 20 along the positive direction of second axis (Y) whereby a uniform magnetic field B1 along the first axis (X) is generated. The second electric current I2 flows into the second conducting structure 21 along the negative direction of the first axis (X) whereby a uniform magnetic field B2 along the second axis (Y) is generated. The third electric current I3 flows along the conducting coil 22 thereby generating a uniform magnetic field B3 along the third axis (Z).

Through the above-mentioned structure design, a three substantially orthogonal, uniform, and stable calibration magnetic fields B1~B3 are capable of being provided for calibrating the accuracy of magnetic field sensing unit appropriately, wherein, in one embodiment, the first conducting structure 20, the second conducting structure 21, and the conducting coil 22 can be manufactured through integrated circuit manufacturing process so that the device 2 is capable of providing three-dimensionally and precisely orthogonal magnetic fields thereby preventing measuring accuracy from being affected by variation induced by manufacturing process. In addition, since the structure for generating three-dimensional and substantially orthogonal magnetic field is provided with three stabilized electric currents through a single electrical power module, the accuracy and feasibility in the practical application can be greatly improved after the magnetic sensing unit is calibrated. Therefore, even if the power module is changed, the ratio of magnetic field between any two axes can be maintained so as to achieve the objective of improving the sensing accuracy of the magnetic sensing unit.

Figure 2:
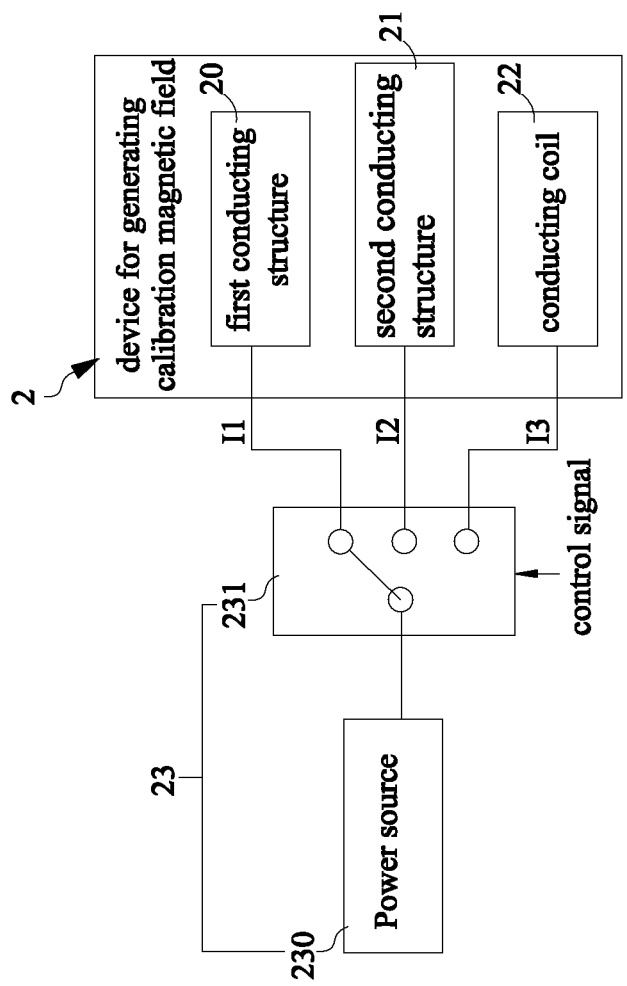
FIG. 2 illustrates a block diagram for generating electric current according to one embodiment of the present invention.

In one embodiment, the three electric currents I1~I3 can be originated from the same power module, or alternatively, originated from a mirror current source with a multiplexer for controlling the ratio of three axes electric currents. For example, please refer to FIG. 2, which illustrates a block diagram for generating electric current. In the embodiment shown in FIG. 2, a power source module 23 comprises a power source 230 for providing a power Vcc, and a multiplexer 231 electrically coupled to the power source 230 for switching the electric currents. The multiplexer 231 is selectively electrically coupled to the first conducting structure 20, the second conducting structure 21, and the conducting coil 22. The multiplexer 231 is controlled to electrically selecting one of the first conducting structure 20, the second conducting structure 21, and the conducting coil 22 to coupled to the power source module 23 through a control signal so that the power source 230 can provide the first, second and third currents I1~I3 to the first conducting structure 20, the second conducting structure 21, and the conducting coil 22, respectively.

Figure 3A:
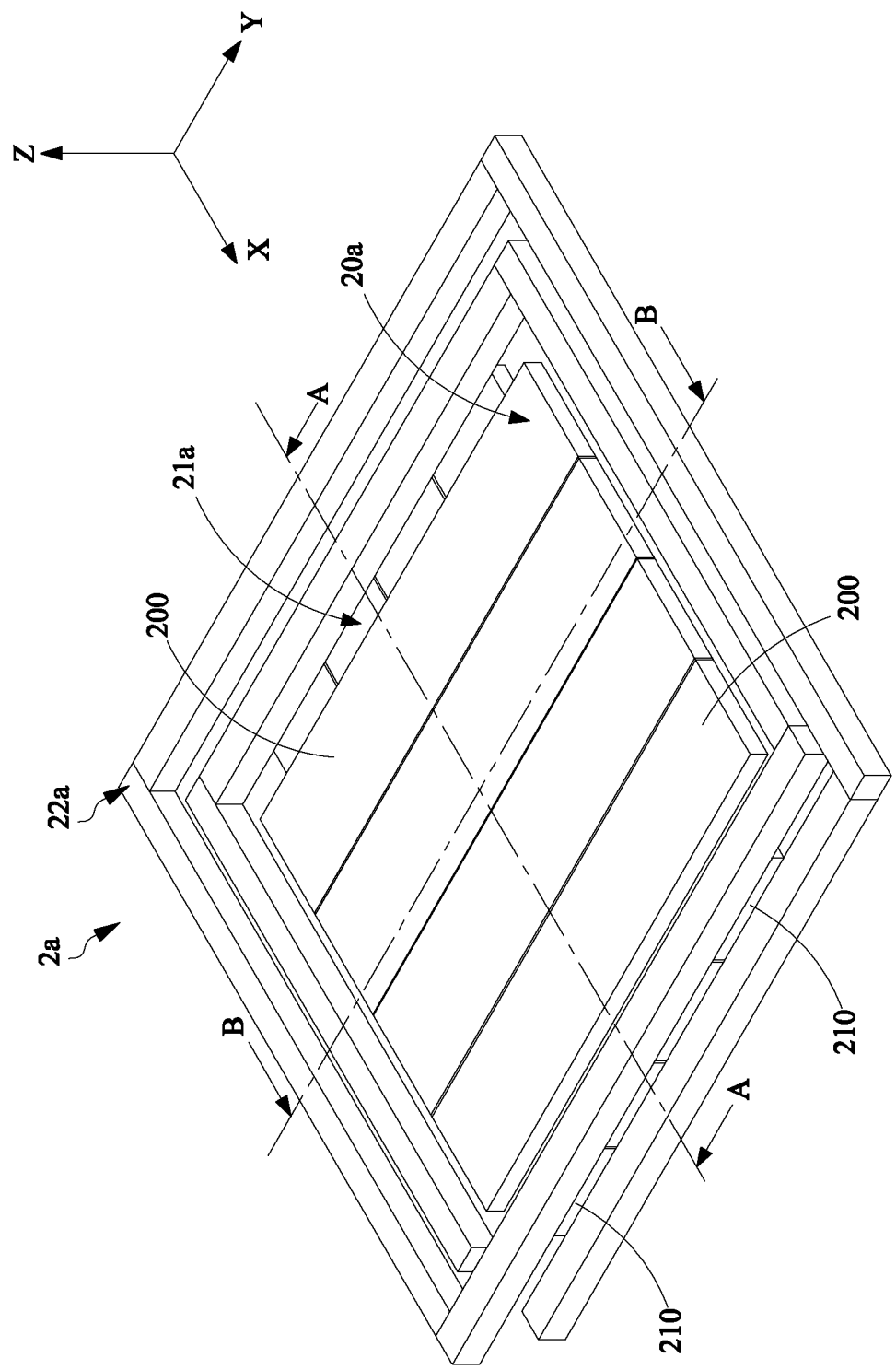
FIG. 3A illustrates a device for generating magnetic field of calibration according to another embodiment of the present invention.

Please refer to FIGS. 3A-3C, in which FIG. 3A is another embodiment associated with the device for generating calibration magnetic field of the present invention, and FIGS. 3B and 3C respectively illustrate a AA cross-sectional view, and BB cross-sectional view of the structure shown in FIG. 3A. In the present embodiment, the device 2a for generating calibration magnetic field is similar to the embodiment shown in the previously described embodiment. The different part is the structures of first, and second conducting structures 20a and 21a, and the conducting coil 22a. In the present embodiment, the first conducting structure 20a is divided into a plurality of first conducting sheets 200, which are evenly separated apart with a fixed interval along the first axis (X), and the second conducting structure 21a is divided into a plurality of second conducting sheets 210, which are evenly separated apart with a fixed interval along the second axis (Y). It is noted that although there are four conducting sheets shown in FIG. 3A, the quantity of divided sheets is determined according to user's need and is not limited to the quantities shown in FIG. 3A. The conducting coil 22a is wound around the first conducting structure 20a with at least two turns wherein the first turn of wire is close to the first conducting structure 20a, while the second turn is wound around an outer side of the first turn of wire.

Figure 4:
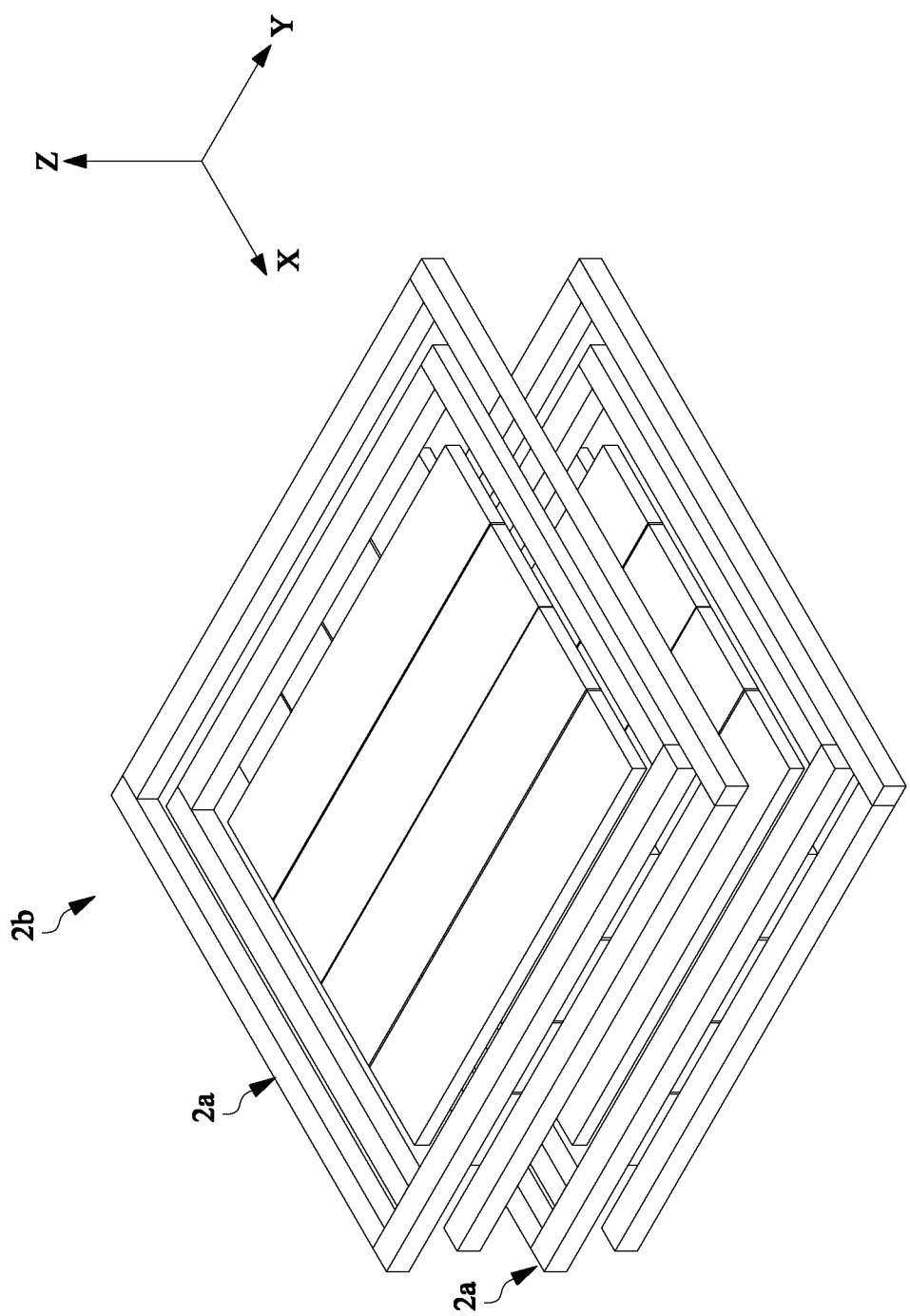
FIG. 4 illustrates a device for generating magnetic field of calibration according to another embodiment of the present invention.

Please refer to FIG. 4, which illustrates device for generating calibration magnetic field according to another embodiment of the present invention. The different part between the present embodiment and the above-mentioned embodiment is that the device 2b is formed by two devices 2a shown in FIG. 3A. The two devices 2a are vertically positioned a distance apart from each other along the third axis (Z), wherein the magnetic sensing unit can be arranged between the two devices 2a. Since the magnetic field along first axis (X) and magnetic field along the second axis (Y) are respectively generated by the parallel structures, and the magnetic field along the third axis (Z) is generated by a coil tube design, a more stabilized and uniform magnetic field can be generated. The coil tube is formed by two conducting coils respectively associated with each device 2a. Alternatively, the device 2a shown in FIG. 4 can be replaced with the device 2 shown in FIG. 1A. Alternatively, one of the devices 2a shown in FIG. 4 can be replaced with the device 2 shown in FIG. 1A.

Figure 5A:
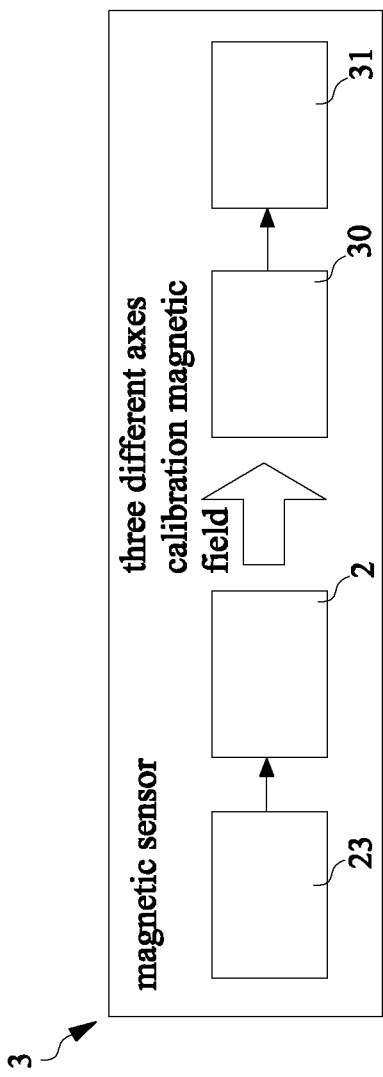
FIGS. 5A and 5B respectively illustrate block diagram of magnetic sensor with self-calibration capability according to two different embodiments of the present invention.

Please refer to FIG. 5A, which illustrates a magnetic sensor having capability of generating self-calibrating magnetic field for performing a self-calibration procedure. In the present embodiment, the magnetic sensor 3 has a power module 23, a device 2 of generating calibration magnetic field, a magnetic field sensing unit 30, and a control module 31. The magnetic sensor 3 can be adapted onto the components such as, the Read/Write head of hard disk, accelerometer, gyroscope, and electric compass measuring magnetic declination, or magnetic variation, for example. The components are able to be applied in the various kinds of application such as, storage device, smart portable device, internet of things (TOT), vehicle component, controlling device and devices using in the bio-medical field. The power source 23 is utilized to provide a stable electric current. In one embodiment, the power source 23 can be the architecture shown in FIG. 2 for selectively providing the electric currents according a switching manner. The device for generating calibration magnetic field can be embodiments in FIG. 1A, 3A or 4. In the present embodiment, the device 2 shown in FIG. 1A is utilized.

The first conducting structure 20 generates the magnetic field B1 along the first axis (X) with a known or predetermined magnitude by a first electric current I1 generated by the power module 23. The second conducting structure 21 generates the magnetic field B2 along the second axis (Y) with a known or predetermined magnitude by a second electric current I2 generated by the power module 23. The magnetic field B2 is substantially perpendicular to the magnetic field B1. The conducting coil 22 generates the magnetic field B3 along the third axis (Z) with a known or predetermined magnitude by a third electric current I3 generated by the power module 23, wherein the magnetic field B3 is substantially perpendicular to the magnetic fields B2 and B1.

Figure 6:
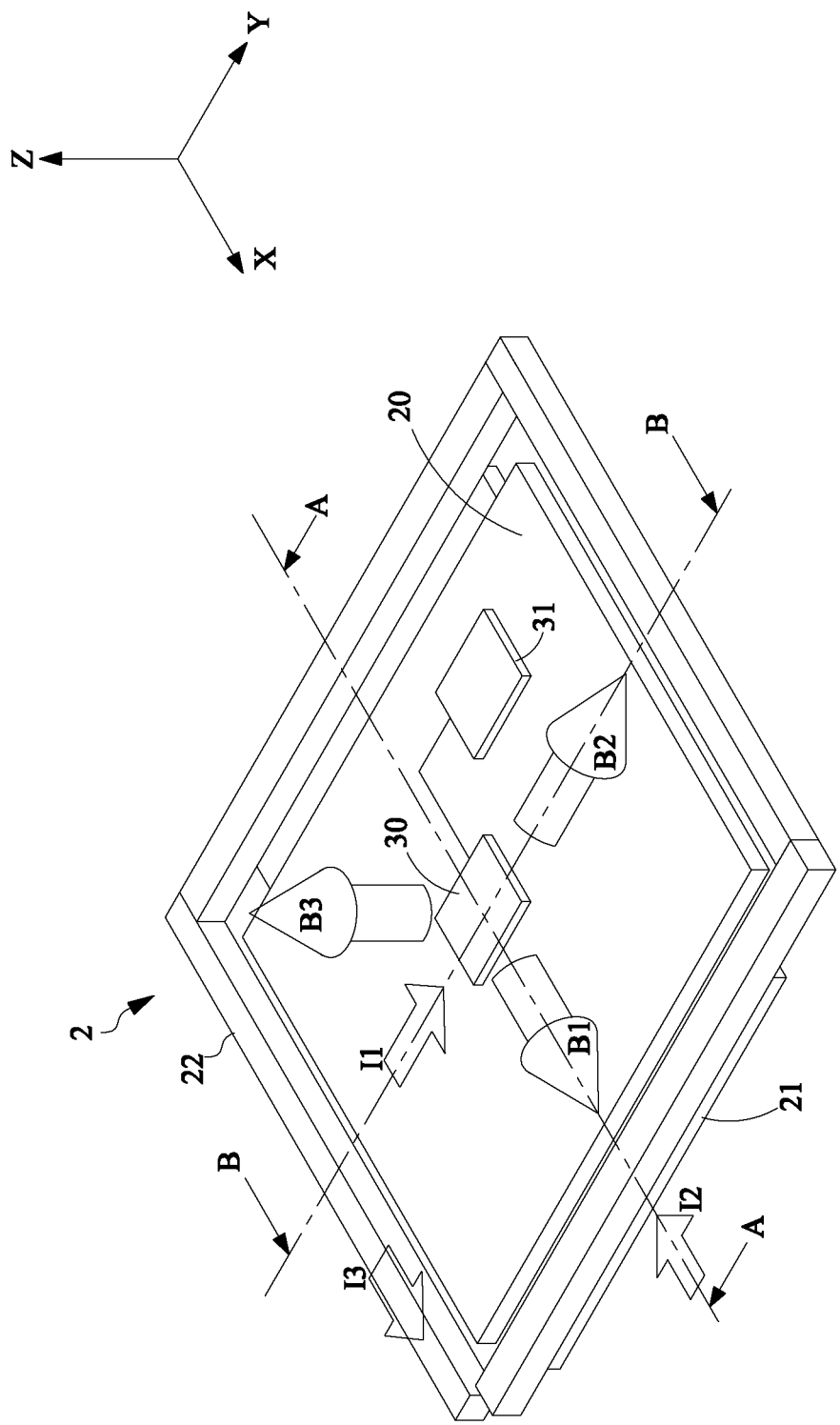
FIG. 6 illustrates structure of the magnetic sensor with self-calibration capability according to one embodiment of the present invention.

Please refer to FIGS. 5A and 6, the magnetic field sensing unit 30 is arranged at one side of the first conducting structure 20 for measuring the calibration magnetic fields comprising first magnetic field B1, the second magnetic field B2 and the third magnetic field B3 and for generating the corresponding sensing information. The magnetic sensing unit 30 can be, but should not be limited to, Hall effect magnetic sensor, anisotropic magnetoresistance (AMR) sensor, giant magnetoresistance (GMR) sensor, tunnel magnetoresistance (TMR) sensor, or the flux gate sensor. Since the device 2 for generating calibration magnetic field is close to the magnetic field sensing unit 30, it is capable of providing three uniform magnetic fields respectively having known or predetermined magnitude, and known or predetermined magnetic field direction such that the magnetic field sensing unit 30 can measure and obtain the corresponding sensing information.

The control module 31 is electrically coupled to the magnetic field sensing unit 30 for receiving the sensing information with respect to each axis and comparing the sensing information of each axis with the known magnitude and magnetic field direction of each corresponding axis thereby determining the calibration information with respect to each axis. In the present embodiment, the device 2 for generating the calibration magnetic field, the magnetic field sensing unit 30, and the control module 31 can be formed as an integrated circuit (IC) through an integrated circuit manufacturing process. It is noted that the integrated circuit is not the only way. For example, alternatively, the control module 31 can be an external processing unit, e.g. IC chip or processor, or external device, such as laptop or desktop computer, for receiving the sensing information of the magnetic field sensing unit 30.

Figure 5B:
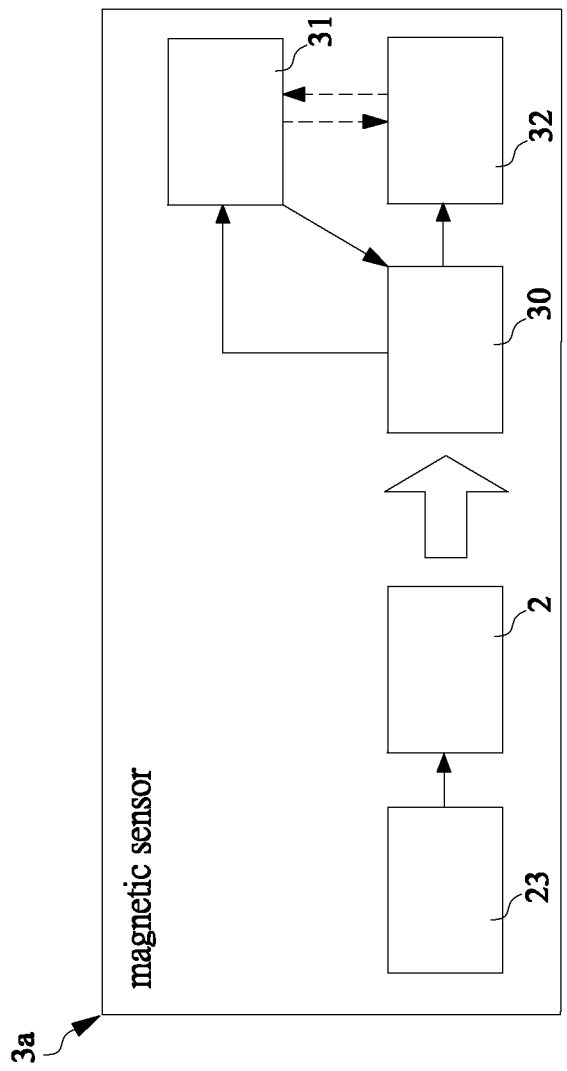

Please refer to FIG. 5B, in the present embodiment, it is similar to the embodiment shown in FIG. 5A, the different part is that a temperature sensing unit 32 is arranged in the magnetic sensor 3a and is electrically coupled to the control module 31. The temperature sensing unit 32 is utilized to detect the temperature or temperature variation information of the magnetic sensor 3a. The temperature or temperature variation information may be, but should not be limited to, temperature or temperature variation in external environment surround the magnetic sensor, the temperature or temperature variation of the magnetic sensor when the magnetic sensor is operated, or the combination thereof.

The detected temperature or temperature variation information is transmitted to the control module 31. Then, the device 2 is controlled to generate a uniform calibration magnetic field of each axis. The magnetic field sensing unit 30 detects the uniform calibration magnetic field and transmits the detected information to the control module 31. In the present embodiment, the device 2, the magnetic field sensing unit 30, the temperature sensing unit 32, and the control module 31 are formed as an integrated circuit (IC) through an integrated circuit manufacturing process. It is noted that the integrated circuit is not the only way. For example, alternatively, the control module 31 can be an external processing unit or external device, such as laptop or desktop computer, for receiving the sensing information of the magnetic field sensing unit 30.

Figure 7:
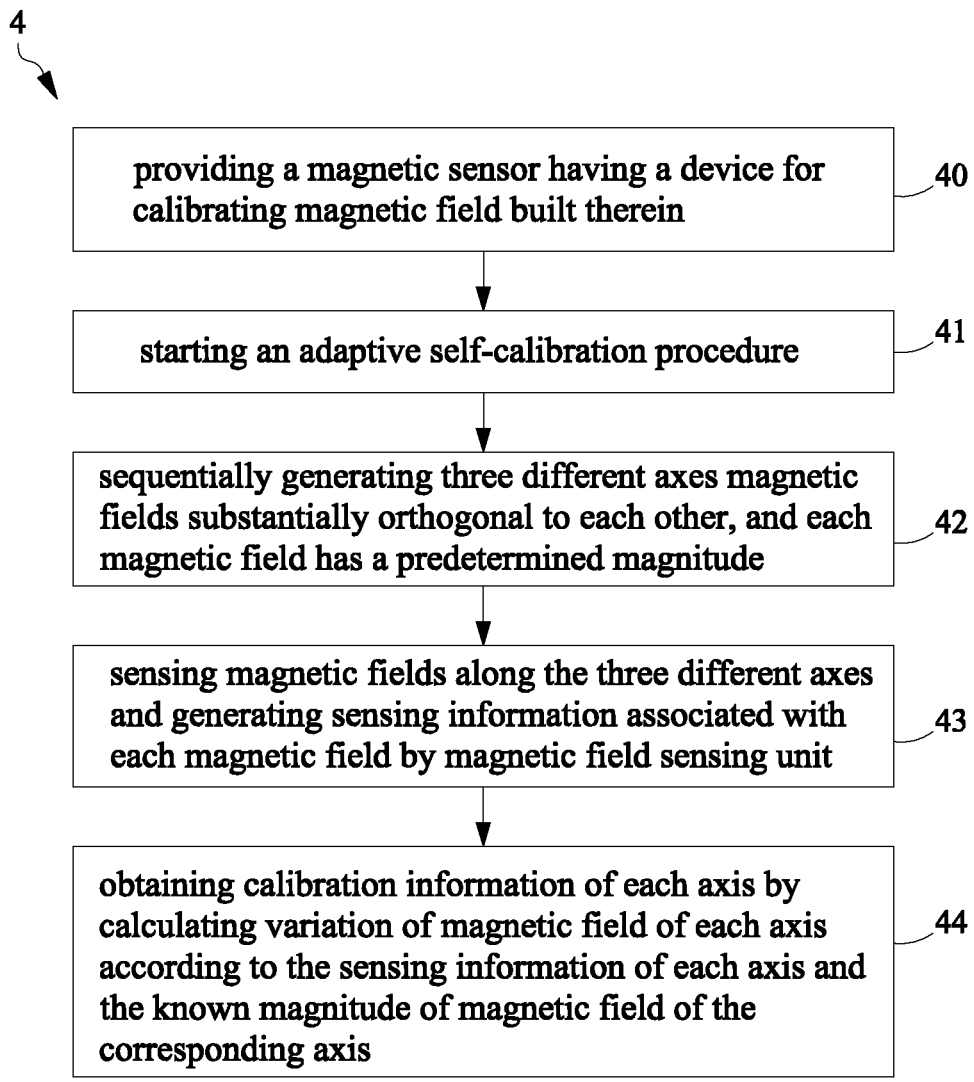
FIG. 7 illustrates a flow chart of a method for calibrating magnetic field according to one embodiment of the present invention.

Please refer to FIG. 7, which illustrates a flow chart of method for calibrating magnetic field according to one embodiment of the present invention. In the present embodiment, the method 4 comprises the following steps. At first, a step 40 is performed to provide a magnetic sensor having a device for calibrating magnetic field built therein. The magnetic sensor comprises a magnetic sensing unit. In the present step, the magnetic sensor can be the embodiment shown in FIG. 5A while the device for calibrating magnetic field can be the device 2, 2a or 2b shown in FIG. 1, FIG. 3A or FIG. 4. Next, a step 41 is performed to start an adaptive self-calibration procedure. It is noted that the magnetic sensor 3 can be arranged into an application device, such as smart portable device, measuring device, or storage device, for example.

In one embodiment, the timing for starting the self-calibration procedure can be, but should not be limited to, timing of turning on the application device, starting the application program, starting to measure the magnetic field, or large variation of temperature or magnetic field occurred. After step 41 is started, the step 42 is performed for sequentially generating three different axes magnetic fields substantially orthogonal to each other, and each magnetic field has a known or predetermined magnitude. In the step 42, the power module 23 shown in FIG. 2 can be utilized to generate electric currents for producing magnetic fields respectively along different axis.

For example, the first electric current I1 flows into the first conducting structure 20 along the positive direction of second axis (Y) whereby the uniform magnetic field B1 along first axis can be generated. The second electric current I2 flows into the second conducting structure 21 along the negative direction of the first axis (X) thereby generating the uniform magnetic field B2 along second axis (Y). Likewise, the third electric current I3 flows along the conducting coil 22 for generating the uniform magnetic field B3 along the third axis (Z) is generated.

Next, the step 43 is performed for sensing the magnetic field B1, B2 or B3 along the three different axes and generating sensing information with respect to each magnetic field along X, Y and Z axes by the magnetic field sensing unit 30. The steps 42 and 43, in one embodiment, can be performed by the following detailed procedure flow. Firstly, the first electric current I1 is controlled to flow into the first conducting structure 20 along the positive direction of second axis (Y) for generating the uniform magnetic field B1 along the first axis (X). After that, the magnetic field sensing unit 30 is controlled to measuring magnetic field B1. Thereafter, the power module 23 is switched to provide the second electric current I2 flowing into the second conducting structure 21 along the negative direction of the first axis (X) for generating the uniform magnetic field B2 along the second axis (Y). After that, the magnetic field sensing unit 30 is controlled to measuring magnetic field B2. Finally, the power module 23 is switched to provide the third electric current I3 flowing into the conducting coil 22 along wound wire for generating the uniform magnetic field B3 along the third axis (Z), and, the magnetic field sensing unit 30 is controlled to measuring magnetic field B3. Alternatively, in addition to the previously mentioned way, in another embodiment, the steps 42-43 can be performed by providing three electric currents simultaneously such that the device 2 can generate three-dimensional magnetic field simultaneously. Then the magnetic field sensing unit 30 is controlled to measuring three different magnetic fields at the time.

After steps 42-43, a step 44 is performed to obtain calibration information of each axis by calculating variation of magnetic field of each axis according to the sensing information of each axis and the known magnitude of magnetic field corresponding to the respective axis. In one embodiment, the calibration information comprises a sensitivity information with respect to magnetic field of each axis and an orthogonality information. The sensitivity information is referred to a ratio of the known magnitude of magnetic field of each axis to the measured magnitude of the magnetic field corresponding to the same axis. For example, Bs1/B1 is referred to the ratio of measured magnetic field Bs1 of X axis to the known and uniform calibration magnetic field B1 generated by the device 2, Bs2/B2 is referred to the ratio of measured magnetic field Bs2 of Y axis to the known and uniform calibration magnetic field B2 generated by the device 2, and Bs3/B3 is referred to the ratio of measured magnetic field Bs3 of Z axis to the known and uniform calibration magnetic field B3 generated by the device 2. The orthogonality information represents the offset angle between the predetermined direction of calibration magnetic field of each axis generated by the device 2 and the maximum bearing angle of the corresponding axis measured by the magnetic sensing unit 30. It is noted that, in the present step, the magnetic field sensing unit 30 respectively measures the calibration magnetic field of each axis, and then transmits the measured information to the control module 31 or external processing device. When the current direction is inverted, two times of magnetic field variation could be obtained thereby obtaining more accurately measuring result. It is noted that there has no specific limitation on the direction of electric current provided by the power module, so it is chosen according to the user's need.

Since the magnitude of calibration magnetic field generated by the device 2 is predetermined and the calibration magnetic field of each axis is uniform and substantially orthogonal to each other, when the sensing information Bs1, i.e. measured information corresponding to calibration magnetic field B1 along X axis, Bs2, i.e. measured information corresponding to calibration magnetic field B2 along Y axis, and Bs3, i.e. measured information corresponding to calibration magnetic field B3 along Z axis, are obtained, Bs1, Bs2, and Bs3 can be transmitted to the control module 31 so that the control module 31 can perform a calculation according to the measured result Bs1~Bs3 and predetermined magnetic field B1~B3 thereby obtaining calibration information of magnetic field variation with respect to each axis.

Figure 8:
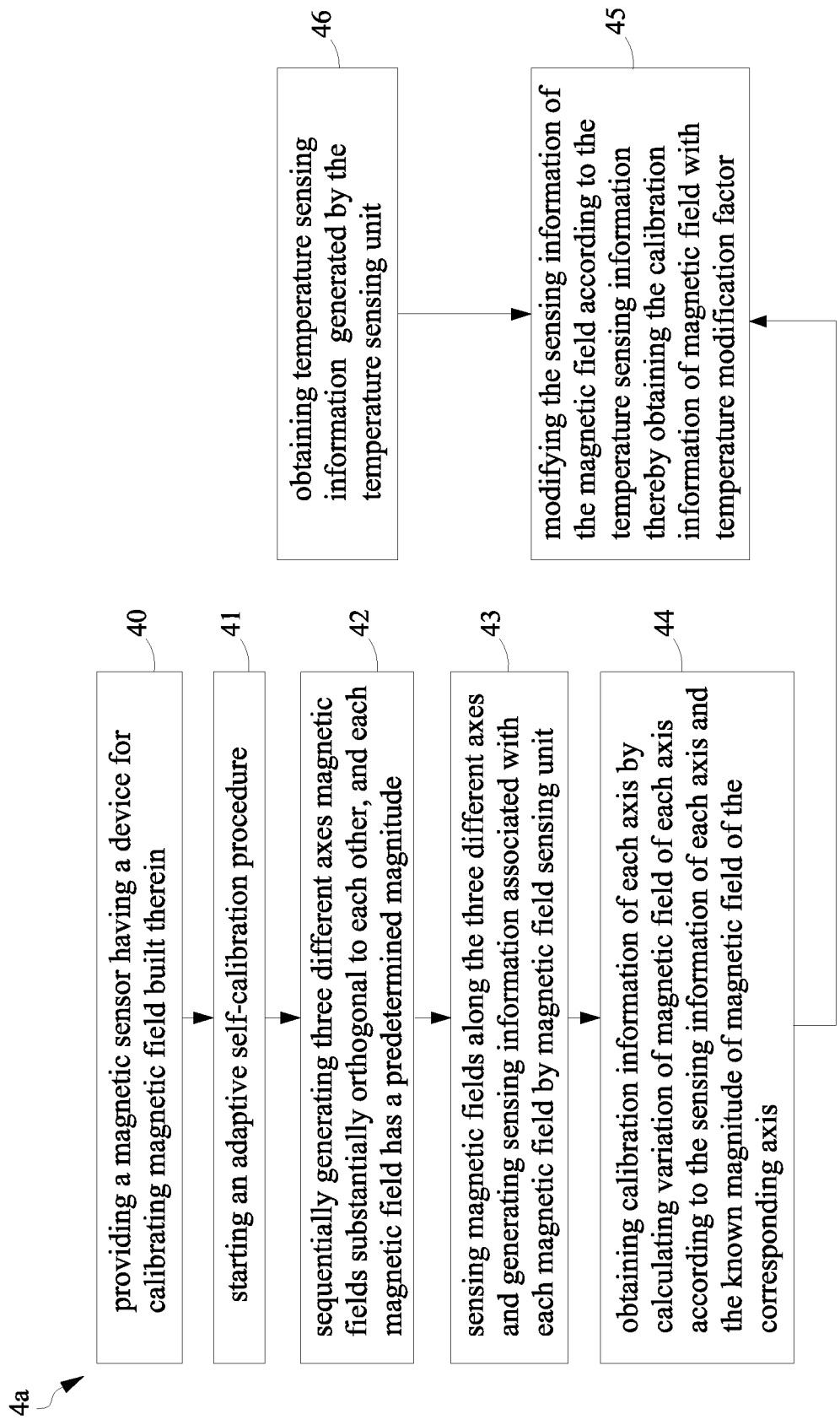
FIG. 8 illustrates a flow chart of a method for calibrating magnetic field according to another embodiment of the present invention.

Please refer to FIG. 8, which illustrates method for calibrating magnetic field according to another embodiment of the present invention. Basically, the flow of method 4a shown in FIG. 8 is similar to the flow shown in FIG. 7. The different part is the embodiment shown in FIG. 5B is utilized as the magnetic sensor. Since there has a temperature sensing unit 32 in the magnetic sensor, the magnetic field affected by the temperature can be modified according to the measured temperature or temperature variation.

Since the magnetic field sensing unit, such as magnetoresistance sensor, for example, is sensitive to the temperature so that when the temperature is varied, the output of the sensing result generated by the magnetic sensing unit will be changed, as well. Therefore, it is capable of establishing database about the relationship between the sensing information outputted by the magnetic field sensing unit 30 under the different temperature environment in advance. In the flow shown in FIG. 8, when the magnetic field is measured, a step 46 can be simultaneously performed to obtain the temperature sensing information generated by the temperature sensing unit 32. After step 44, the step 45 is performed to modify the sensed magnetic field of the magnetic sensing unit according to the temperature sensing information thereby obtaining the calibration information of magnetic field with temperature modification factor.

It is noted that, in one embodiment, when a temperature sensing unit 32 is integrated into the magnetic sensor, the measured temperature sensing information can be a criteria for determining if the self-calibration procedure is necessary to be executed or not. Through the criteria, the time cost for self-calibration procedure can be reduced so that the output efficiency can be improved.

Alternatively, in another embodiment, when the self-calibration procedure is started at the beginning, the initial temperature is recorded. After that, the variation of temperature is measured and monitored. When the temperature is changed, a sensitivity relationship between the temperature and magnetic field is utilized to modify the measured magnetic field whereby the output efficiency can be achieved and the convenience of utilization can be greatly improved when the large variation of temperature is occurred. Alternatively, in case of when the embodiment of the present invention is adapted to electric compass, if the variation of sensitivity associated with each axis is identical, the variation of temperature could be ignored without affecting the measurement accuracy of the magnetic sensor.

Figure 9A:
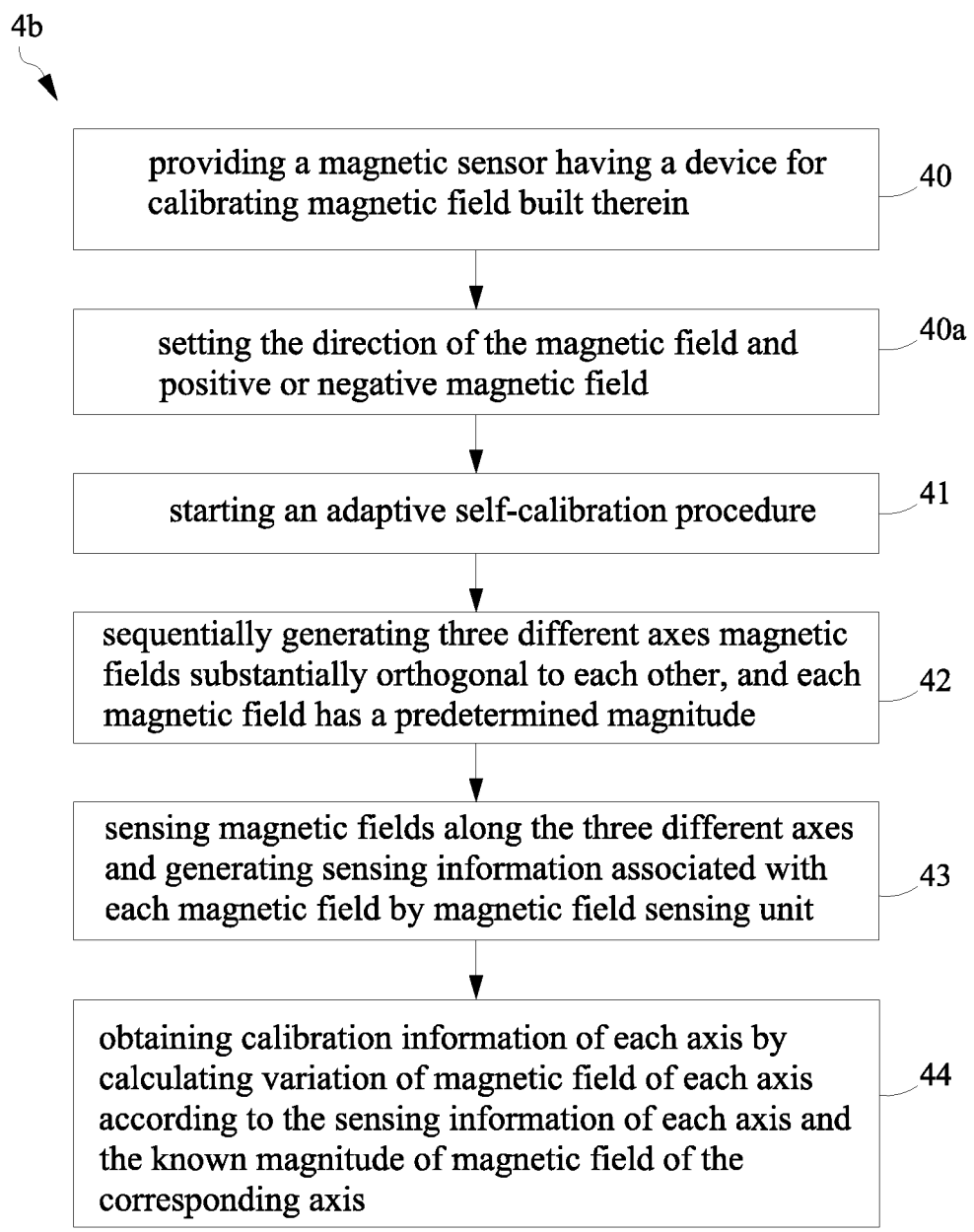
FIGS. 9A and 9B respectively illustrate different flow chart of a method for calibrating magnetic field according to two different embodiments of the present invention.
Figure 9B:
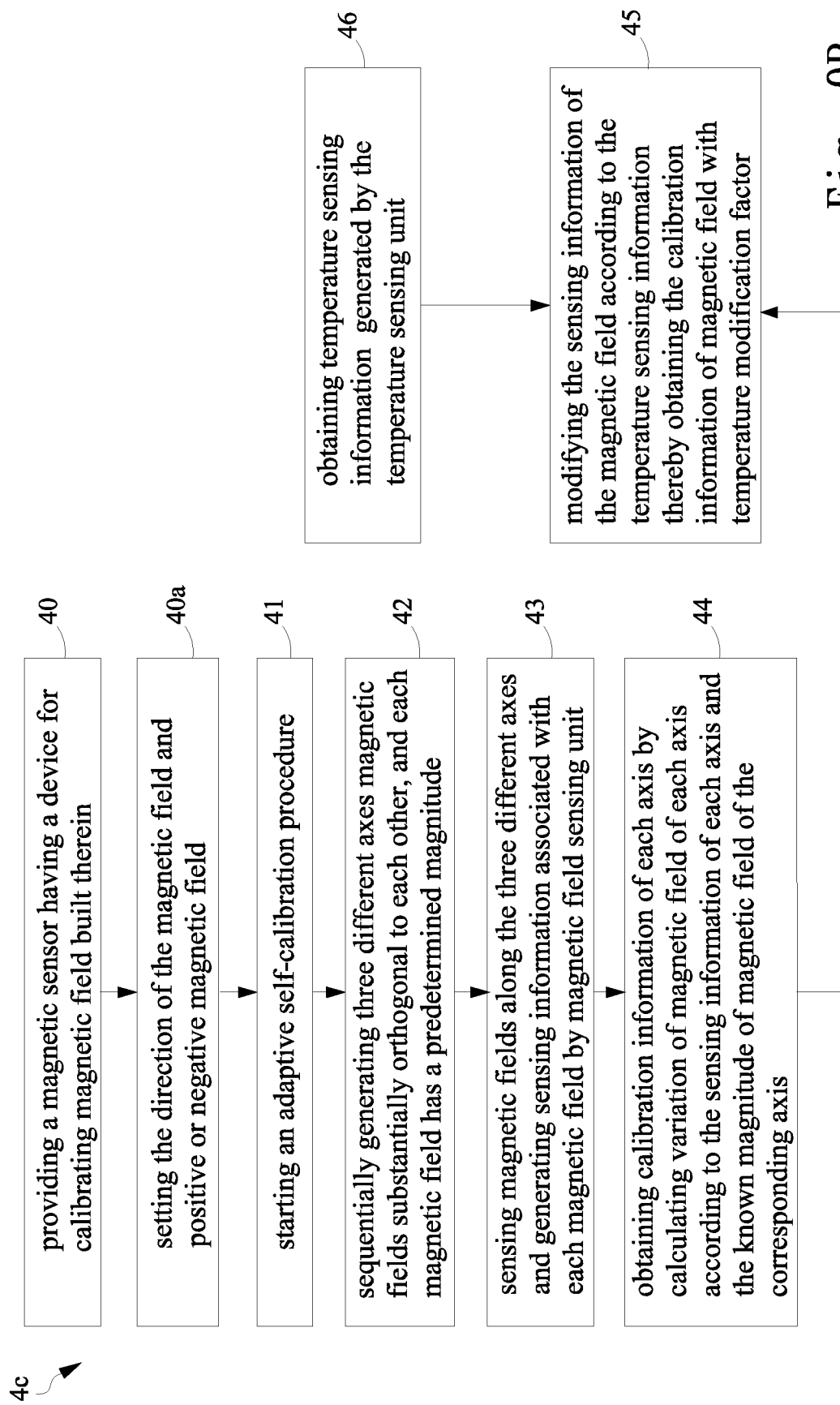

Please refer to FIGS. 9A and 9B, which respectively illustrate calibration method according to different embodiments of the present invention. Basically, the flow 4b shown in FIG. 9A is similar to the flow shown in FIG. 7, wherein the different part is that in the flow shown in FIG. 9A, it further comprises a step 40a for configuring the direction of the magnetic field and positive or negative magnetic field. Likewise, the flow shown in FIG. 9B is similar to the flow shown in FIG. 8, wherein the different part is that in the flow 4c shown in FIG. 9B, it further comprises a step 40a for configuring the direction of the magnetic field and positive or negative magnetic field.

It is noted that, in one embodiment, the way for adjusting the magnitude of the magnetic field in each axis (X, Y, and Z) can be implemented through adjusting the magnitude of the electric current provided by the power module. Regarding the way for changing the direction of magnetic field, it can be implemented through a control of flow direction of the electric current. It is noted that, when the electric current forwardly flows and reversely flows, the 2 times of variation of the magnetic field could be obtained for increasing accuracy of the measuring result. Likewise, the magnitude and flowing direction of the electric current can be varied for adjusting the magnetic field, whereby the measuring accuracy could be improved and the application field could be expanded. It is noted that the adjustment of direction of magnetic field and flowing direction of electric current are not the limitation of the present invention, and are depending on the user requirement.

After the magnetic sensor is calibrated through the above-mentioned calibration method, such as flow in one of FIGS. 7-8 and FIGS. 9A-9B, the obtained calibration information including the sensitivity information and orthogonality information of each axis can be utilized to compensate the measured result of magnetic field when the magnetic sensor is adapted in the practical application thereby ensuring the accuracy of measuring the magnetic field.

Figure 10:
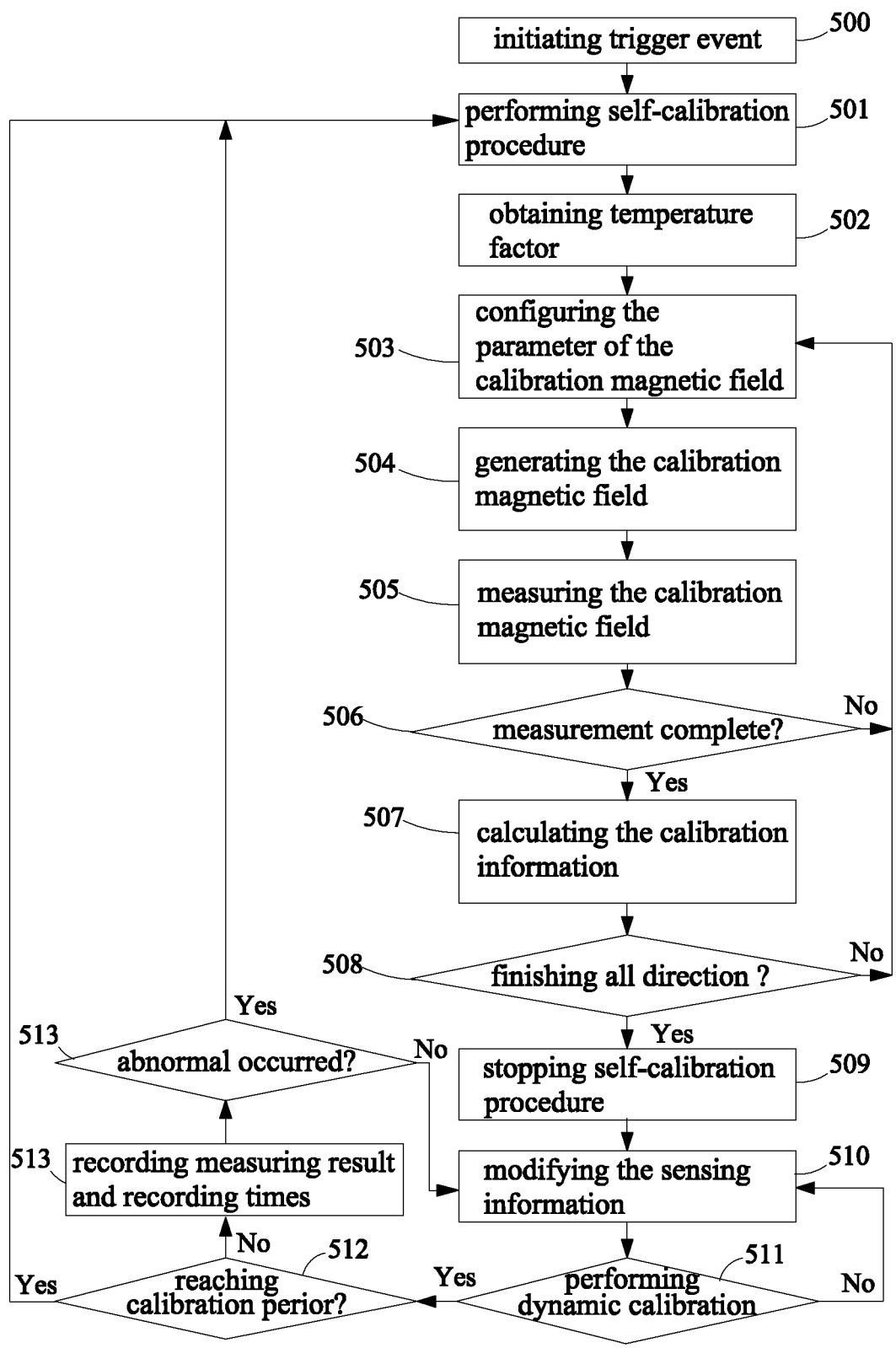
FIG. 10 illustrates a flow chart of a method for calibrating magnetic field according to a further embodiment of the present invention.

Please refer to FIG. 10, which illustrates a calibration method according to another embodiment of the present invention. In the present embodiment, the magnetic sensor is adapted in an integrated application. The magnetic sensor comprises a device for generating calibration magnetic field, the magnetic field sensing unit and the temperature sensing unit like the embodiment shown in FIG. 5A or FIG. 5B. The magnetic sensor is disposed in an application device, such as smart portable device, which may be a smart phone or pad computer, for example. The calibration method 5 is started by step 500 initiating a trigger event, which can be, but should not be limited to, powering on an application device having the magnetic sensor, starting to execute an application program associated with the magnetic sensor, or detecting a variation of temperature. When the trigger event is occurred, step 501 is performed for starting the self-calibration procedure. In the self-calibration procedure, step 502 is performed to detect the temperature or temperature variation information for determining temperature factor that may affect the measuring result of magnetic field. In the preset step, the temperature information or temperature variation information can be adapted to modify the variation of measuring sensitivity of magnetic field induced by the temperature or temperature variation.

After step 502, the step 503 is performed to configure the parameter of the calibration magnetic field, such as magnitude of magnetic field direction (X, Y, and Z) and positive or negative direction of magnetic field. Next, step 504 is performed to generate the calibration magnetic field of first axis (X) according to the configured parameter in step 503. The step 505 is performed to measure the calibration magnetic field of axis X. After that, since the magnetic field in the negative direction is not measured, the step returns to step 503 to configure the magnetic field along the negative direction of X axis. Then steps 504~505 is performed. When the positive and negative magnetic fields of X axis are measured, the step 507 is performed to calculate the calibration information of X axis, which comprises sensitivity information and orthogonality information. For example, in the present embodiment, since the calibration magnetic field along X axis has known magnitude, theoretically, the sensing information would be (Bx, 0, 0). However, since the magnetic field of X axis may be affected by environmental factor or the previously described factors, the sensing information would become (Bx, by, bz), wherein the "by" and "bz" represents the sensitivity information and orthogonality information on Y and Z axis.

Likewise, after X axis is measured, step 508 is performed to determine if calibration magnetic field in X, Y, or Z axis is finished or not. If Y and Z axis are not finished yet, the steps will return to step 503 for configuring the Y or Z axis and repeating the steps of 503~508. After the calibration information of X, Y, and Z axes are obtained, the step 509 is executed to stop the self-calibration procedure. After the self-calibration procedure, the magnetic sensor is applied to start the detection. And then the step 510 is performed to modify the sensing information with respect to the magnetic field measured in the practical application in the real environment according to the calibration information obtained by steps 502 and 507, whereby the accuracy of sensing information associated with the magnetic field in real practical application can be maintained, and the sensing capability of the magnetic sensor can be prevented from being influenced by the environment.

The steps 511~513 represent the dynamic calibration procedure of the magnetic sensor. When the dynamic calibration procedure is started, the procedure will monitor if there has any abnormal status in sensing the magnetic field or not. Once the abnormal status is occurred, the self-calibration procedure is initiated. In one embodiment, step 511 is performed to start the dynamic calibration procedure, such as configuring the period for performing the self-calibration, for example. Next, step 512 is performed to monitor if the period is reached or not. Once the period is reached, the flow returns to the step 501 to start the self-calibration procedure. If the period is not reached, step 513 is executed to record the measuring times and corresponding measuring result of the magnetic field. Then step 514 is performed to examine if there has abnormal measuring result. If the abnormal measuring result is occurred, even if the monitoring period is not reached, the step 501 will be started to execute the self-calibration procedure. If there has no abnormal measuring result, the step 510 will be returned to measure the magnetic field in the practical application in the real environment and modify the measured magnetic field according to the calibration information.

According to the above-mentioned embodiments, the device for generating calibration magnetic field and self-calibration method of the present invention can be utilized to calibrate the magnetic sensor before the manufactured magnetic sensor, or magnetic sensing unit, such as AMR, GMR, TMR and flux gate sensor, for example, leaving the factory. When the magnetic sensor or the like is installed into the consuming devices after leaving the factory, the magnetic sensor can perform the self-calibration anytime, and anywhere under any environmental condition thereby maintaining accuracy of the magnetic sensor and reducing the error during the real measurement. Therefore, the present invention can solve cost issue that is induced by the conventional improvement of manufacturing process for enhancing the measuring accuracy.

In addition, not only can the cost be reduced, but the measuring accuracy can also be improved thereby making the magnetic sensor more durable and reliable. For example, please refer to FIG. 11 which illustrates a sensing curve with respect to the magnetic sensor. Generally speaking, in the conventional magnetic field sensing unit, such as magentoresi stance sensor, for example, the output voltage or current corresponding to the sensed magnetic field is illustrated as the curve 90 shown in FIG. 11. After a calculation of linear regression, the straight line 91 is obtained and shown in FIG. 11. According to the curve 90 and straight line 91, it is clear that the available measuring interval is shown as area D in FIG. 11, because there has no linear relationship between output current or voltage and sensed magnetic field in the other area outside the available measuring interval D. If those areas are utilized, the measuring error will be occurred and varied with the magnitude of the magnetic field. Accordingly, the available measuring interval D can be regarded as the reliable area for measuring the magnetic field in the conventional magnetic sensor.

Figure 11:
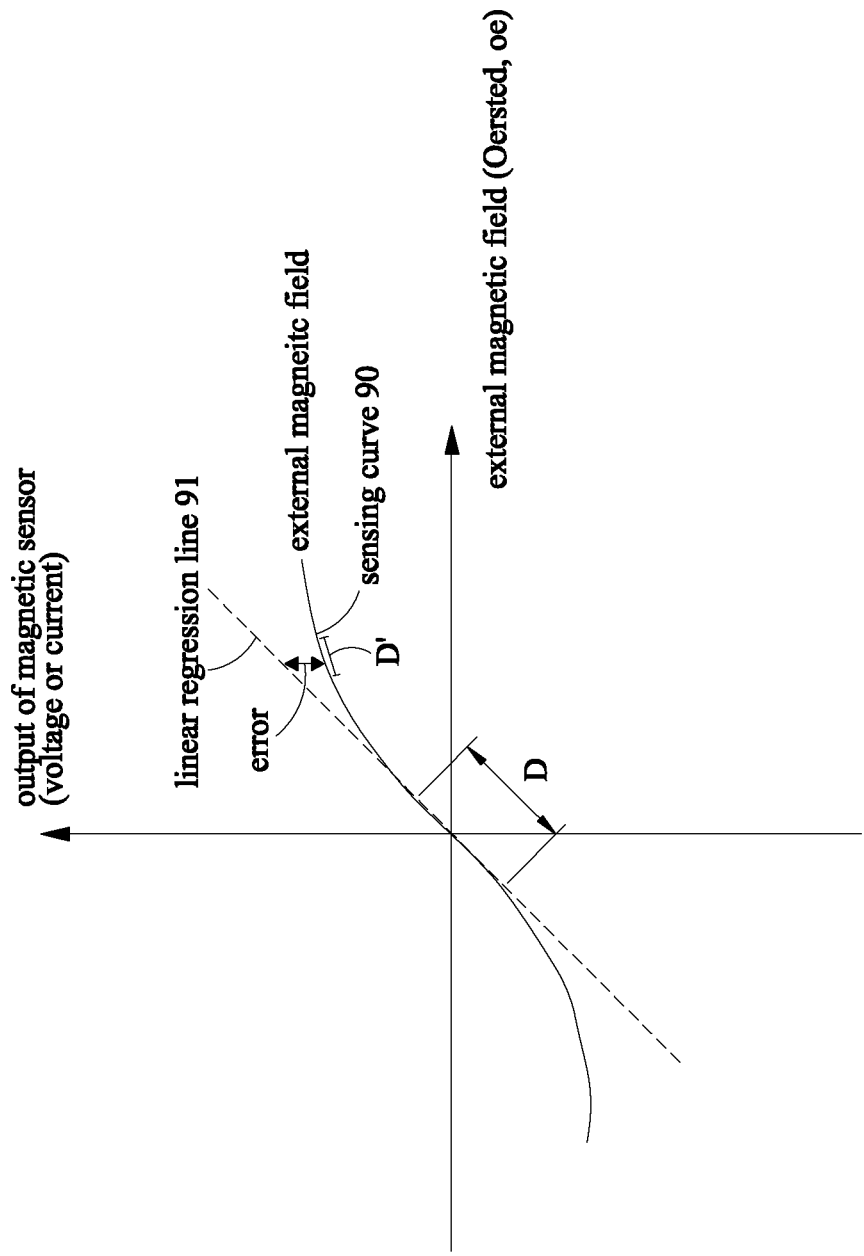
FIG. 11 illustrates a sensing curve of a magnetoresistance sensing element.

However, when the magnetic sensor having the magnetic field sensing unit, e.g. magnetoresistance sensor, is integrated with the device for generating the calibration magnetic field according to the present invention, the self-calibration procedure can be performed anytime and anywhere so that even if in the nonlinear relationship interval, such as area D' shown in FIG. 11, it can still establish a new sensing base level for establishing the calibration information under the environment where the magnetic sensor exists whereby the magnetic sensor can be operated normally even it is operated under the condition that would affect the accuracy of the measurement, such as condition of aging deterioration when the MR elements are utilized for a long period of time, environmental temperature, or magnetic field generated by the electrical elements surrounded the MR elements.

While embodiments of the present invention have been particularly shown and described, it will be understood by those skilled in the art that various changes in form and detail may be without departing from the spirit and scope of the present invention.

What is claimed is:

1. A device for generating magnetic field of calibration, comprising:
a first conducting structure, generating a first magnetic field with respect to a first axis through a first electric current, wherein the first conducting structure has a bottom plane with respect to a first axis and a second axis;
a second conducting structure, substantially parallel to the first conducting structure, the second conducting structure generating a second magnetic field with respect to the second axis substantially orthogonal to the first axis through a second electric current, wherein the second conducting structure has a top plane with respect to the first axis and the second axis and the top plane has a distance apart from the bottom plane along a third axis, and is substantially parallel to the bottom plane; and
a conducting coil, peripherally arranged around the first and second conducting structures, the conducting coil generating a third magnetic field with respect to the third axis substantially orthogonal to the first and second axes through a third electric current, wherein the conducting coil has a top surface, a bottom surface, an inner surface close to the first conducting structure and an outer surface that is opposite to the inner surface.

2. The device of claim 1, further comprising a power module, which comprises a power source for providing the first, second and third electric currents, and a multiplexer electrically coupled to the power source and selectively switched to electrically couple the power source to one of the first conducting structure, the second conducting structure, and the conducting coil according to a control signal.

3. The device of claim 1, wherein a flowing direction of the first electric current is substantially orthogonal to a flowing direction of the second electric current.

4. The device of claim 3, wherein the conducting coil is formed by a conducting wire wound at least one turn around the first and second conducting structures, and the conducting coil has an axial direction substantially orthogonal to the flowing directions of the first and second electric currents.

5. The device of claim 1, wherein the first conducting structure further comprises a plurality of first sheets arranged side-by-side with a distance apart from each other.

6. The device of claim 1, wherein the second conducting structure further comprises a plurality of second sheets arranged side-by-side with a distance apart from each other.

7. A built-in self-calibration magnetic sensor, comprising:
a first magnetic field generating device, comprising a first conducting structure, a second conducting structure, and a conducting coil having a top surface, a bottom surface, an inner surface close to the first conducting structure and an outer surface that is opposite to the inner surface, wherein the first conducting structure generates a first magnetic field through a first electric current, the second conducting structure is substantially parallel to the first conducting structure and generates a second magnetic field with respect to a second axis substantially orthogonal to the first axis through a second electric current, and the conducting coil is peripherally arranged around the first and second conducting structures and generates a third magnetic field with respect to a third axis substantially orthogonal to the first and second axes through a third electric current, wherein the first conducting structure has a bottom plane with respect to the first axis and the second axis, the second conducting structure has a top plane with respect to the first axis and the second axis, the top plane has a distance apart from the bottom plane along the third axis, and is substantially parallel to the bottom plane;
a magnetic field sensing unit, generating a sensing information in response to detection of the first, second and third magnetic fields; and a control module, electrically coupled to the magnetic field sensing unit for receiving the sensing information and comparing the sensing information corresponding to each axis with a predetermined magnetic field of the corresponding axis, respectively, for determining a calibration information associated with the first, second and third magnetic fields.

8. The magnetic sensor of claim 7, further comprising a power module, which comprises a power source for providing the first, second and third electric currents, and a multiplexer electrically coupled to the power source and selectively switched to electrically couple the power source to one of the first conducting structure, the second conducting structure, and the conducting coil according to a control signal.

9. The magnetic sensor of claim 7, wherein a flowing direction of the first electric current is substantially orthogonal to a flowing direction of the second electric current.

10. The magnetic sensor of claim 9, wherein the conducting coil is formed by a conducting wire wound at least one turn around the first and second conducting structures, and the conducting coil has an axial direction substantially orthogonal to flowing directions of the first and second electric currents.

11. The magnetic sensor of claim 7, wherein the first conducting structure further comprises a plurality of first sheets arranged side-by-side with a distance apart from each other.

12. The magnetic sensor of claim 7, wherein the second conducting structure further comprises a plurality of second sheets arranged side-by-side with a distance apart from each other.

13. The magnetic sensor of claim 7, further comprising a second magnetic field generating device arranged at a side of the first magnetic field generating device whereby the magnetic field sensing unit is arranged between the first and second magnetic field generating devices.

14. The magnetic sensor of claim 7, further comprising a temperature sensing unit.

15. The magnetic sensor of claim 7, wherein the calibration information further comprises a sensitivity information with respect to magnetic field of each axis and an orthogonality information.

16. A method for calibrating magnetic field, utilized to perform a self-calibration procedure, comprising steps of:
providing a magnetic sensor comprising a device for generating a calibration magnetic field, the device comprising a magnetic field sensing unit, wherein the device comprises a first conducting structure having a bottom plane with respect to a first axis and the a second axis, a second conducting structure having a top plane with respect to the first axis and the second axis, and a conducting coil having a top surface, a bottom surface, an inner surface close to the first conducting structure and an outer surface that is opposite to the inner surface, wherein the top plane has a distance apart from the bottom plane along a third axis, and is substantially parallel to the bottom plane;
generating, by the device, three different magnetic fields respectively along the first axis, the second axis, and the third axis, wherein each magnetic field has a predetermined magnitude and the three different magnetic fields are substantially orthogonal to each other;
sensing, by the magnetic field sensing unit, the three different magnetic fields respectively along the first axis, the second axis, and the third axis, and generating a sensing information respectively corresponding to each axis; and
comparing the sensing information of each axis with the predetermined magnitude of each magnetic field along the corresponding axis for determining a calibration information associated with each axis.

17. The method of claim 16, wherein the calibration information further comprises a sensitivity information with respect to magnetic field of each axis and an orthogonality information.

18. The method of claim 16, further comprising a trigger event for starting the self-calibration procedure.

19. The method of claim 18, wherein the trigger event is occurred when powering on an application device having the magnetic sensor, starting to execute an application program associated with the magnetic sensor, or detecting a variation of temperature.

* * * * *